United States Patent [19]

Hayashi et al.

[11] Patent Number: 4,776,883
[45] Date of Patent: Oct. 11, 1988

[54] PROCESS FOR THE PRODUCTION OF SILVER-PALLADIUM ALLOY FINE POWDER

[75] Inventors: Takao Hayashi; Akio Ushijima; Yoshinobu Nakamura, all of Shimonoseki, Japan

[73] Assignee: Mitsui Mining & Smelting Co., Ltd., Tokyo, Japan

[21] Appl. No.: 50,832

[22] Filed: May 14, 1987

[30] Foreign Application Priority Data

May 30, 1986 [JP] Japan ............................ 61-125495

[51] Int. Cl.$^4$ .............................................. B22F 9/24
[52] U.S. Cl. ................................. 75/0.5 A; 148/126.1
[58] Field of Search .................... 75/0.5 A; 148/126.1

[56] References Cited

U.S. PATENT DOCUMENTS 3,390,981  7/1968  Hoffman ........................... 75/0.5 A
4,678,505  7/1987  Bushey ............................. 75/0.5 A

*Primary Examiner*—Wayland Stallard
*Attorney, Agent, or Firm*—Flynn, Thiel, Boutell & Tanis

[57] ABSTRACT

According to the present invention, hydrazine or a hydrazine compound is added to an acidic solution containing silver and palladium as ions to thereby reduce-separate silver-palladium alloy fine powders having an average particle diameter of 0.01–1.0 micron. The powders may be heat-treated at 100°–500° C. in an inert atmosphere or vacuum to thereby obtain silver-palladium alloy fine powders that have an average particle diameter of 0.01–1.0 micron and are usable in the manufacture of ceramic capacitors.

11 Claims, 7 Drawing Sheets

(a) Ag-Pd ALLOY POWDER (Pd 30 wt %)

(b) Ag-Pd ALLOY POWDER (Pd 20 wt%)

Ag-Pd MIXED POWDER (Pd 15 wt %)

Ag-Pd COMMERCIALLY AVAILABLE MATTER (Pd 30 wt %)

PROCESS FOR THE PRODUCTION OF SILVER-PALLADIUM ALLOY FINE POWDER

BACKGROUND OF THE INVENTION

1. Field of the Invention

The present invention relates to a process for the production of a silver-palladium alloy fine powder that may be used for the production of electrode materials, contacts or the like used in the electronic industries field, in particular for the production of ceramic capacitors or the like.

2. Description of the Prior Art

In the electronic industries field, silver-palladium pastes have been widely used in thick film conductive circuits employed in screen printing. The objects of using silver-palladium alloys are to repress the migration occurring when wiring is made by the use of silver alone, to raise the melting point of silver by adding palladium so that the conditions for using substrates at desired temperatures are applicable, and the like.

In recent years, with the small size and precision of electronic parts, there have been growing demands for decreasing the thickness of conductive films to several microns and narrowing the width of and between wiring circuits (to, for instance, 100 microns). To meet such demands, it is required that the conductive metal powder consistuting the paste should have a small particle diameter, an even grain size and a uniform composition.

In contrast with this, the fact is that the silver-palladium paste has usually been used in the manner of mixing separately manufactured silver powder and palladium powder for a very long period of time and then judging their mutual uniform dispersion.

This process has the following problems:

(1) A very long period of time such, for instance, as several tens of hours is needed for the dispersion of the powders, and in addition thereto, (2) The heterogeneity in composition in the microscopic region cannot be avoided.

Accordingly, the demands for said electronic parts can never be completely satisfied.

In addition, the use of the usual silver-palladium mixture for the inner electrode of the ceramic capacitors has been followed by such disadvantages that delamination is very likely to be caused between the electrode and the ceramic and the capacity of the capacitor is likely to be lowered. This is because said mixed powder undergoes abnormal expansion and shrinkage during the alloy formation during the heat treatment which is conducted at temperatures lower than the burning point of the ceramic to increase its strength, namely in the range of 100°–500° C. This tendency becomes more violent as the film thickness of dielectrics becomes thinner.

As a way to solve the above problems, it has been proposed to use a silver-palladium alloy powder. Some reports thereon have been made. For instance, there are enumerated Japanese Laid Open Patent Application No. 11701/1983, Japanese Laid Open Patent Application No. 132503/1984 and Japanese Laid Open Patent Application No. 224111/1984. From the viewpoint of the powder manufacturing process there is enumerated Japanese Laid Open Patent Application No. 56125/1978.

However, the abovementioned prior art processes for the production of silver-palladium alloy powders are comprised of heat-reducing a mixed oxide or mixed hydroxide of silver and palladium in a stream of hydrogen (Japanese Laid Open Patent Application No. 11701/1983, Japanese Laid Open Patent Application No. 132503/1984 and Japanese Laid Open Patent Application No. 56125/1978) or of mixing the silver powder and palladium powder and then heating same at 300° C. in air (Japanese Laid Open Patent Application No. 224111/1984).

However, these processes are not industrially profitable because of their needing of precursors to be alloyed, namely oxide, hydroxide or 2 kinds of metal powders, using dangerous hydrogen, and the like. Further, heating to high temperatures in air is not preferable because the particles are mutually sintered, and the silver and palladium are oxidized. In addition these prior art processes have such problems as the powder prepared by said process being partially alloyed and coexistent with silver and a palladium powder, whereby delamination can never be prevented completely.

SUMMARY OF THE INVENTION

The object of the present invention is to eliminate the usual problems and propose a process that is capable of manufacturing a silver-palladium alloy fine powder by means of simple wet process and apparatus, said fine powder having a silver-palladium alloy composition controlled to an optimum composition, being free from delamination when used as the inner electrode of a ceramic capacitor and being usable profitably in the electronic industries field.

That is, the present invention comprises mixing hydrazine or its compound (which is called a hydrazine compound hereinafter) in an acidic solution containing silver and palladium as ions; reduction-separating a silver-palladium alloy fine powder having an average particle diameter of 0.01–1.0 micron; subjecting the powders to filtration, washing and drying in the usual manner; and further heat-treating, if necessary, the powders at temperatures of 100°–500° C. in an inert atmosphere or vacuum, thereby obtaining a silver-palladium alloy fine powder that has an average particle diameter of 0.01–1.0 micron and is free from delamination.

BRIEF DESCRIPTION OF THE DRAWINGS

FIG. 1 illustrates the state of said powder not subjected to heat-treatment, FIG. 2 illustrates the state of said powder subjected to heat-treatment at 200° C. for 60 min in $N_2$, and FIG. 3 illustrates the state of said powder subjected to heat-treatment at 400° C. for 60 min in $N_2$ respectively.

FIG. 4 illustrates the state of said alloy fine powder not subjected to heat-treatment, FIG. 5 illustrates the state of said alloy fine powder subjected to heat-treatment at 200° C. for 60 min in $N_2$, and FIG. 6 illustrates the state of said alloy fine powder subjected to heat-treatment at 400° C. for 60 min in $N_2$ respectively.

DETAILED DESCRIPTION OF THE INVENTION

Figure 2:
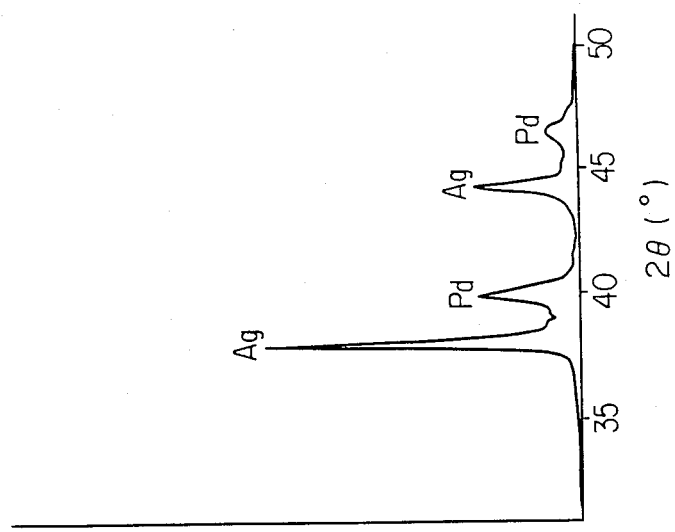
FIG. 1–FIG. 3 are each an X-ray diffraction view of the silver-palladium mixed powder (Pd 30 wt.%).

The present invention employs a solution in which silver ions and palladium-ions coexist as starting substances. As the source of silver ions, there is used an aqueous solution containing silver as ions, preferably an aqueous silver nitrate solution. As the source of palladium ions, there may be used any solution which contains palladium as ions, preferably an aqueous palladium nitrate solution. A palladium chloride solution is not preferable because chlorine ions react with said coexistent silver ions to cause silver chloride precipitates which prohibit silver from being used effectively as ions of the starting substance and the final product is in danger of containing chlorine which has a bad influence as the wiring circuit material, and the like.

Said aqueous silver nitrate solution and aqueous palladium nitrate solution are mixed into an acidic nitric solution. The "acidic solution" is necessary for the production of silver-palladium alloy fine powder. The preferable silver and palladium ion concentrations in the mixed solution are 10–200 g/l respectively. The concentration ratio of silver to palladium can be selected in response to the composition of the finally produced silver-palladium alloy fine powder. That is, the composition ratio of the silver-palladium alloy fine powder of the present invention can be controlled readily and optionally by changing the concentration ratio of the mixed solution of the starting substance, namely said mixed solution of silver and palladium.

As the result of this, not only is a alloy powder suitable for the paste used in the silver-palladium thick film conductive circuit obtained but also a silver-palladium alloy fine powder having an extremely wide range of palladium content can be produced.

Next, a hydrazine compound is added to a mixed acidic solution of silver and palladium for reduction—separation of silver ions and palladium ions in the form of fine powder. Further, the composition of said alloy powder is determined by the concentration ratio of the mixed solution as it is to the reduction separated powder. The utility of the present invention consists therein.

The proper amount of the hydrazine compound added is 2–10 times the equivalent required for reduction of silver ions and palladium ions contained in said silver-palladium mixed solution. When said amount is less than 2 times, the reduction is insufficient or the reducing reaction takes a long period of time. When said amount is more than 10 times, it incurs a loss of superfluous hydrazine compound.

As the hydrazine compound to be used as the reducing agent there may be used any compound that contains hydrazine as a component and is able to reduce in the same manner as that of hydrazine. In particular, hydrazine hydrate is preferable.

The temperature of the reducing solution is preferably in the range of 10°–100° C. When the temperature is lower than said range, there is a tendency that the reaction is delayed and, further, the composition of the alloy fine powder obtained is not homogenized. While in the case said temperature is higher than 100° C., the operation becomes difficult because the solution boils.

In order to accelerate the reaction, there may be used conventional ways such as stirring or the like so that the hydrazine compound may react effectively with the whole amount of silver ions and palladium ions contained in the solution. The reaction is continued until the bubbles caused by the progress of the reaction disappear and no more change is observed.

Next, the solution containing reduction-separated silver-palladium alloy fine powders in a slurry state is subjected to solid-liquid separation in a conventional manner so as to separate and recover said fine powders from said solution. The conventional manner referred to herein may be any prior art manner such as gravitational sedimentation, reduced-pressure filtration, centrifugal separation, pressure filtration or the like.

Next, the separated and wet fine powders are subjected to after-treatment in a conventional manner. In other words, said fine powders are washed with water to remove the solution component attached onto said fine powders. Then, prior to drying, the fine powders are washed with a low boiling solvent, thereby replacement removing the water attached onto the fine powders. In this case, a hydroxyl group-free solvent such as acetone is used as the low boiling solvent. A hydroxyl group-containing solvent is not profitable in that said solvent does not operative effectively and further is not preferable from the viewpoint of safety operation because said solution is subject to spontaneous combustion by catalysis of the silver-palladium fine powder.

Next, the separation-recovered alloy fine powder with the low boiling solvent attached thereon is dried to thereby remove the low boiling solvent by volatilization. The atmosphere under which drying is conducted may be any one of air, inert gas and vacuum, but normally it is preferable to conduct the drying in air. The drying temperature is not specifically limited. When drying is conducted in the air, it may be conducted at temperatures in the range of room temperature to about 90° C.

The aforesaid silver-palladium fine powder can be obtained by alloying silver and palladium as referred to afterwards, and its particle diameter is very fine (0.01–1.0 micron).

The obtained silver-palladium alloy fine powder may then be heat-treated at temperatures of 100°–500° C. in an inert atmosphere or vacuum. Because of this heat-treatment, the surface area of the silver-palladium alloy fine powder is decreased, and simultaneously the silver-palladium alloy fine powder becomes more uniform in structure. In this connection, it is to be noted that in case this heat-treating temperature is less than 100° C., the effect of said heat-treatment is not sufficient. When said heat-treating temperature is in excess of 500° C., in contrast, there can not be seen any development of the surface area and the structural uniform state. This heat-treatment may be performed on the water soluble liquid slurry per se from which the alloy fine powder is formed, or may be performed on the drying-recovered fine powder by using any one of the dry and wet methods.

The specific surface area of the silver-palladium alloy fine powder before the heat-treatment is 5-30 $m^2/g$. One example thereof, although varying depending on factors such as manufacturing conditions, particle diameter, powder composition and the like, is shown in Table-1. The results obtained from the silver-palladium alloy fine powder after heat-treatment is shown in Table-2. It can be seen from Table-2 that the heat-treatment makes the fine roughness of the surface smoother and thereby reduces the specific surface area. In addition, the structure of the alloy is also unified by the heat-treatment, which will be referred to afterwards.

As previously discussed, the heat-treatment functions to reduce the specific surface area. This fact leads to that when using the alloy powder as a paint or paste material, the reduced specific surface area can prevent the occurrence of increased oil absorption, lowered oxidation resistance and other inconveniences caused when the surface area is too large.

TABLE - 1

| Sample | Pd composition (wt. %) | Specific surface area ($m^2/g$) | Average particle diameter ($\mu m$)* |
|---|---|---|---|
| A | 20 | 13.1 | 0.2 |
| B | 30 | 20.0 | 0.2 |

*The average particle diameter is a value measured from an electron microscope photo

TABLE - 2

| Sample | Pd composition (wt. %) | Specific surface area before heat-treatment ($m^2/g$) | Heat-treating atmosphere | Specific surface area after heat-treatment ($m^2/g$) | |
|---|---|---|---|---|---|
| | | | | 100° C. | 200° C. |
| A | 20 | 13.1 | Air | 10.5 | 8.0 |
| | | | Nitrogen | 8.0 | 4.5 |
| B | 30 | 20.0 | Air | 10.5 | 6.5 |
| | | | Nitrogen | 9.5 | 4.5 |

The state of alloying will be explained from the analytical results obtained by X-ray diffraction hereinafter.

Figure 1:
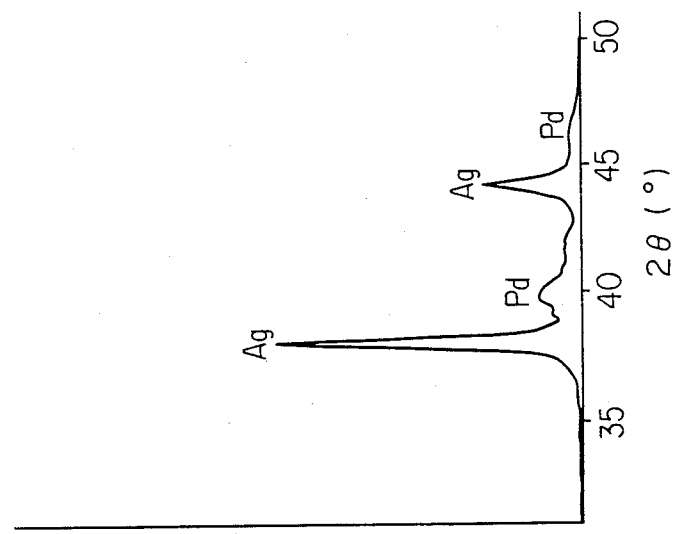
Figure 4:
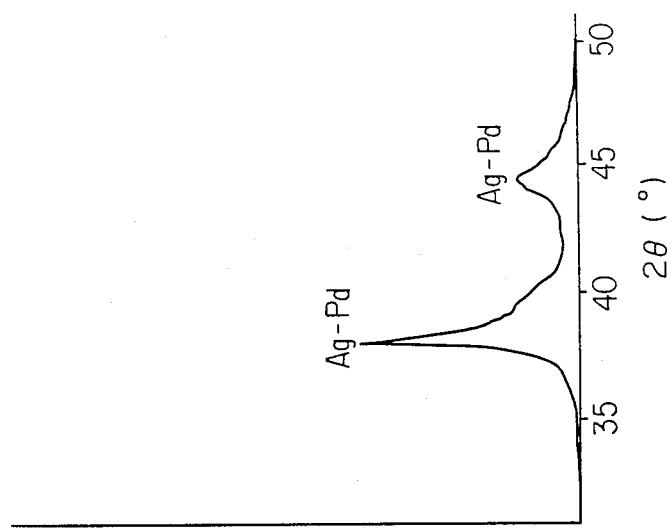
FIG. 4–FIG. 6 are each an X-ray diffraction view of the silver-palladium alloy fine powder (Pd 30 wt.%) according to the present invention.
Figure 3:
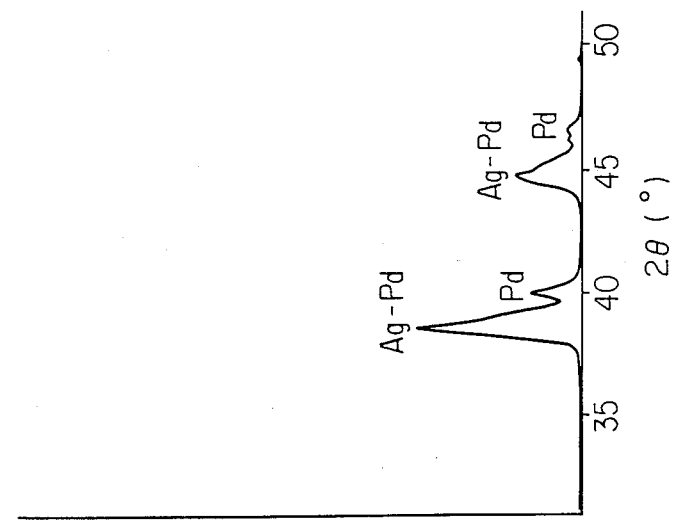
Figure 5:
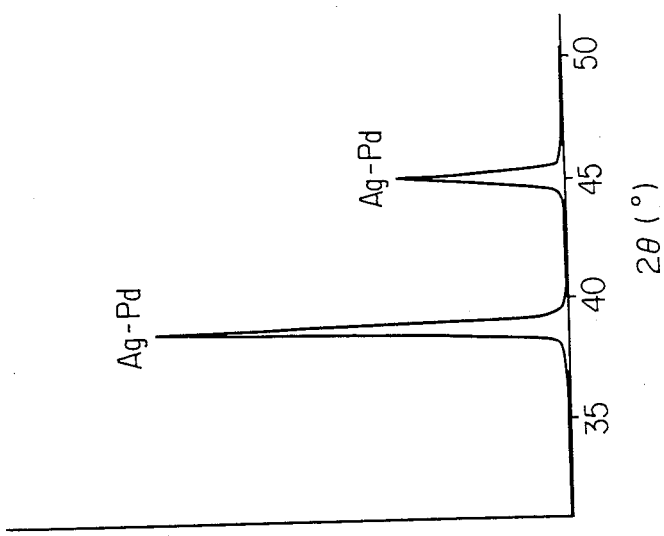
Figure 6:
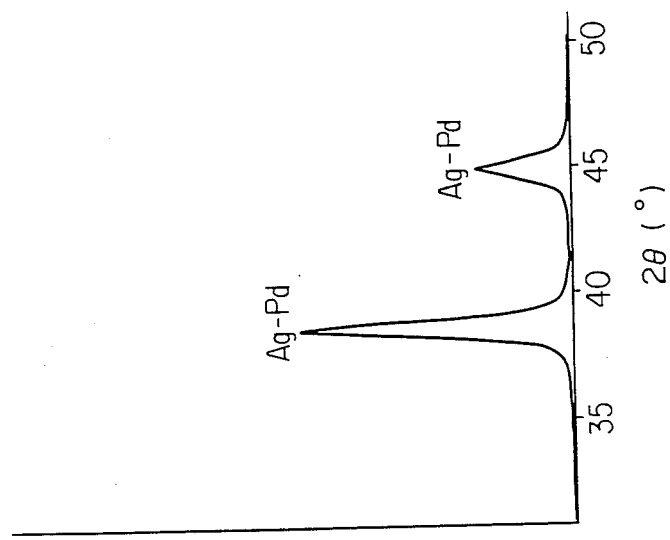

FIG. 1 to FIG. 3 illustrate comparative examples, and FIG. 4 to FIG. 6 illustrate data pertaining to the present invention.

FIG. 1 is an X-ray diffraction view of a 30 wt.% palladium-containing silver-palladium mixed powder obtained by mixing a commercially available silver powder (0.2 micron) and palladium powder (0.1 micron) for a long period of time. It can be seen therefrom that silver and palladium each has its own peak and is in a mere mixed state.

FIG. 2 illustrates said mixed powder heat-treated at 200° C. and for 60 minutes in nitrogen, and FIG. 3 illustrates said mixed powder heat-treated at 400° C. and for 60 minutes in nitrogen. It can be seen therefrom that when treated at 200° C., no change is observed in the mixed state, and that when treated at 400° C., the mixed powder is observed to be partially alloyed for the first time but still contain palladium in the form of a simple substance.

FIG. 4 is an X-ray diffraction view of a 30 wt.% palladium-containing silver-palladium alloy fine powder (average particle diameter 0.2 micron) prepared according to the process of the present invention. FIG. 5 and FIG. 6 are X-ray diffraction views of said alloy fine powder treated at 200° C. and for 60 minutes in nitrogen and treated at 400° C. and for 60 minutes in nitrogen respectively.

It can be seen therefrom that the powder according to the process of the present invention has already been alloyed in contrast with the case of said mixed powder. FIG. 6 illustrates the case where the solids have dissolved completely, thereby causing particle growth and a more unified structure.

The mechanism wherein the silver-palladium alloy powder is obtained by the aforesaid process of the present invention is not completely understood, but is considered to consist in that, to begin with, nuclei are formed, silver-palladium ultrafine particles grow, (several tens Å) cohere and contact mutually, and said particles diffuse and fuse together for alloying.

The present invention as mentioned above is advantageous in that silver or palladium powder-free alloyed silver-palladium fine powders, can be treated at industrially handy temperatures of 100°-500° C. and give fine powders whose specific surface area has been greatly reduced and whose alloying state has been more improved; when said fine powders are used as inner electrodes in ceramic capacitors, the occurrence of delamination can be prevented completely; said particles can be suitably used in other electronic industries; and the silver-palladium alloy fine powders can be prepared by a simple wet process and apparatus which are free from the use of hydrogen.

According to the present invention, furthermore, little Ag diffuses in a dielectric substance and evaporates on burning because silver and palladium are in the alloyed state. In addition, in comparison with the fine powder obtained by means of other processes, the fine powders according to the present invention exhibit little oxidation. Therefore, the fine powders of the present invention is lowered in reactivity with the dielectric substance. Due to this, the capacity of the capacitor can be expected to be maximized.

The present invention will be explained more concretely with reference to the Examples hereinafter.

EXAMPLE 1

Figure 7:
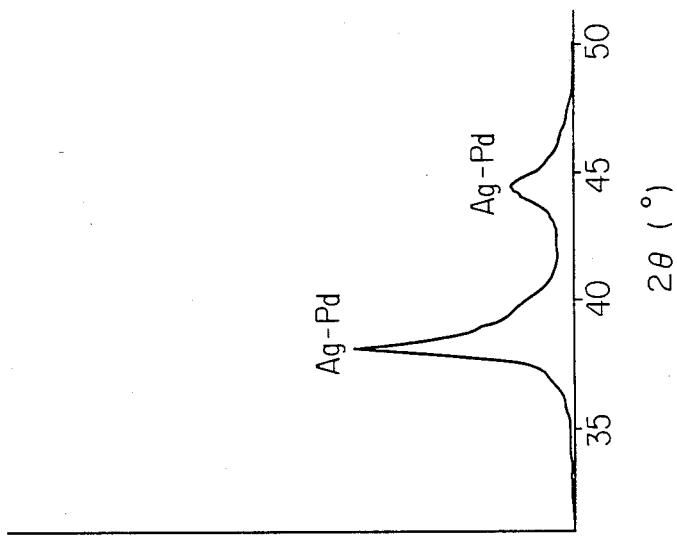

2425.7 g (10 times the theoretical amount) of hydrazine hydrate was added to 59.93 l of an acidic nitric solution (silver ion concentration: 18.69 g/l, palladium ion concentration: 8.01 g/l, temperature: 20° C.) in 30 minutes, and said mixture was reacted for 40 minutes. The reduction-separated silver-palladium alloy fine powders were filtered by means of a natural gravity filter, washed with 55 l of water, fed into 9 l of acetone and filtered, and thereafter were dried at 70° C. in a normal atmosphere, thereby obtaining 1600 g of silver-palladium alloy fine powders. The obtained silver-palladium alloy fine powder was a high purity fine powder that was composed of 70% silver and 30% palladium, was superior in dispersibility and had narrow particle size distribution width, an average particle diameter of 0.2 micron meter, a specific surface area of 19 $m^2/g$ and Na, K, Cl<10 ppm. From its X-ray diffraction results, said silver-palladium alloy fine powder was found to have peak as shown in FIG. 7. This powder, that had been heat-treated at 200° C. for 10 minutes in the nitrogen atmosphere, came to be more progressively alloyed and have a specific surface area of 6.00 m²/g. The heat-treated powder was formed into a cylindrical pellet, that is 5 mm in diameter and 5 mm in height, at a pressure of 1000 Kg/cm² by means of a double pushing type forming jig. Said pellet was measured twice in respect of expansion and shrinkage up to 900° C. at a temperature up rate of 20° C./min. in the air by means of an expansion coefficient meter. The obtained results were shown in FIG. 9(a). It can be seen therefrom that the expansion and contraction at 350° C.-500° C., which are called into question when said pellet was used for an inner electrode in a ceramic capacitor, were scarcely observed. This powder was mixed with a glass frit, an organic binder and an organic solvent. This mixture was made into a paste. This paste was screen printed on an alumina substrate, and burned at 900° C. for 10 minutes in the air. The resistivity of the obtained thick film was $3.4 \times 10^{-5}$ Ω·cm.

EXAMPLE 2

139.7 g (10 times the theoretical amount) of hydrazine hydrate was added to 1 l of an acidic nitric solution (silver ion concentration: 80 g/l, palladium ion concentration: 20 g/l, temperature: 20° C.) in 15 minutes, and said mixture was reacted for 30 minutes. The reduction-separated silver-palladium alloy fine powder was filtered, washed and dried in the same manner as employed in Example 1, thereby obtaining 100 g of silver-palladium alloy fine powders.

Figure 8:
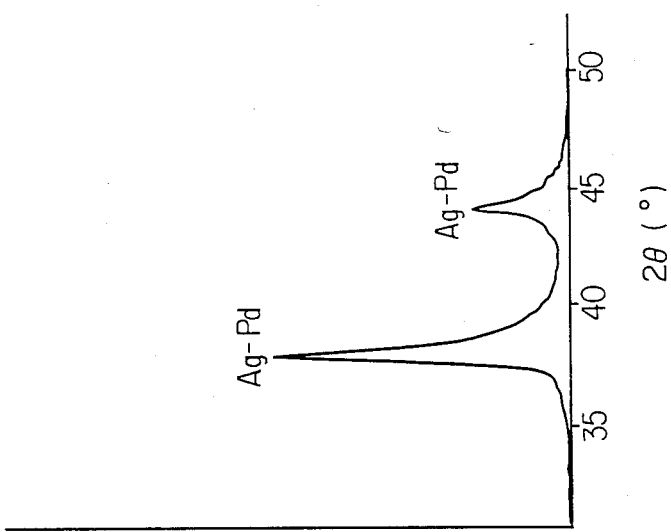
FIG. 7 and FIG. 8 are X-ray diffraction views of the silver-palladium alloy fine powder (Pd 30 wt.%) obtained by Example 1 and the silver-palladium alloy fine powder (Pd 20 wt.%) obtained by Example 2 respectively.

The obtained powder was a high purity fine powder that was composed of 80% of silver and 20% of palladium and had a particle diameter of 0.2 micron meter, a specific surface area of 9.93 m²/g and Na, K, Cl<10 ppm. From its X-ray diffraction results, said silver-palladium alloy fine powder was found to have peaks as shown in FIG. 8. This powder, which had been heat-treated at 200° C., came to be more progressively alloyed and had a specific surface area of 5.65 m²/g. The heat-treated powder was measured twice with respect to expansion and shrinkage in the same manner as employed in Example 1.

Figure 9:
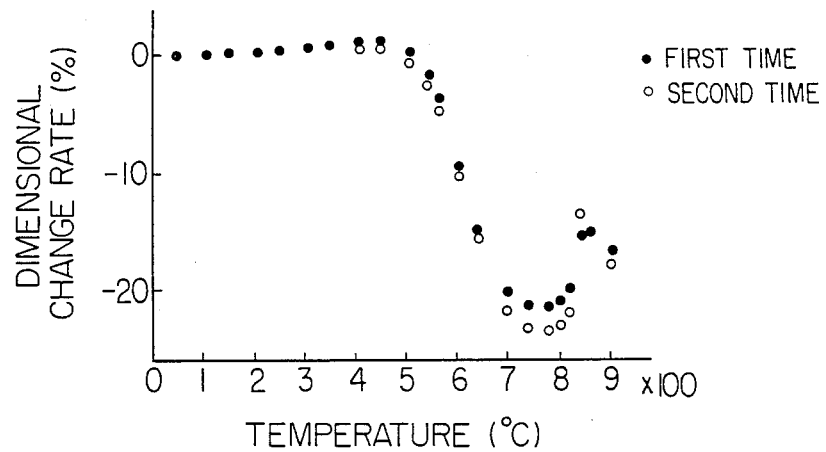
FIGS. 9(a) and (b) are views illustrating the relationship between the temperature and the dimensional change rate of the silver-palladium alloy fine powder obtained by Example 1 and the silver-palladium alloy fine powder obtained by Example 2 respectively.
Figure 9:
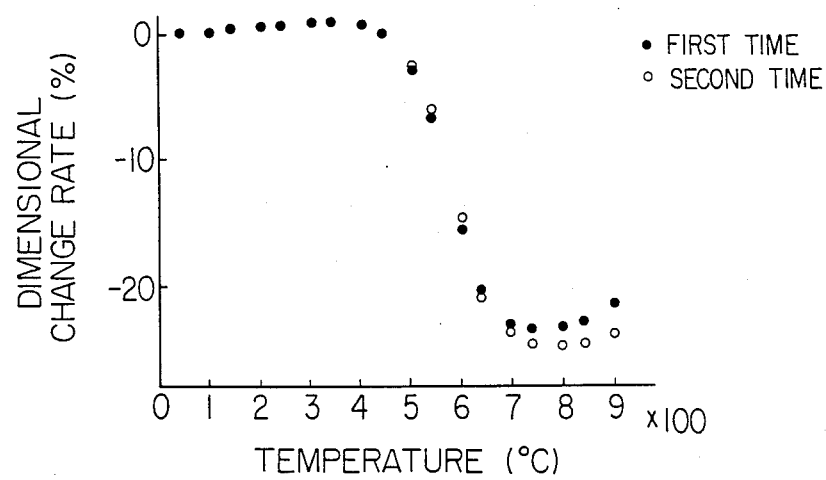

The obtained results were shown in FIG. 9(b). The expansion and shrinkage at 350° C.-500° C. were scarcely observed. The resistivity of the thick film obtained by paste printing and then burning at 900° C. for 10 minutes was $1.2 \times 10^{-5}$ Ω·cm.

COMPARATIVE EXAMPLE 1

Figure 10:
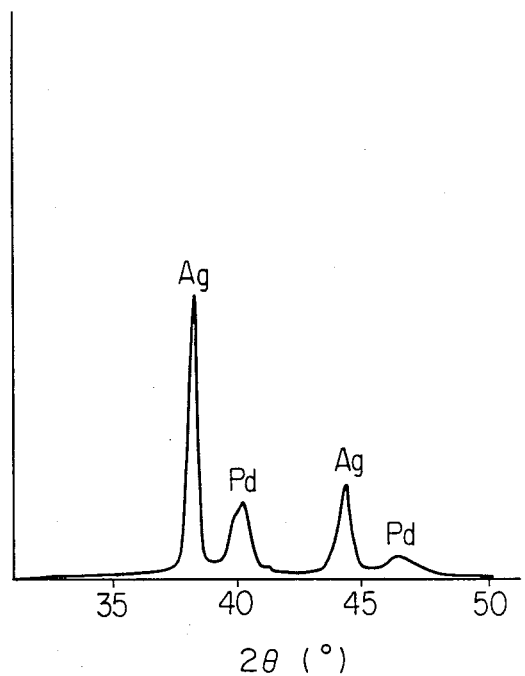
FIG. 10 is an X-ray diffraction view of the silver-palladium fine powder obtained by Comparative Example 1.

22.74 g (3 times the theoretical amount) of hydrazine hydrate was added to 1.87 l of a silver-palladium ammonium complex solution (silver ion concentration: 18.69 g/l, palladium ion concentration: 8.01 g/l, temperature: 20° C., pH: 9.0), and said mixture was reduced. The reduction-separated silver-palladium fine powders were filtered by means of a natural gravity filter, were washed with 2 l of water, and thereafter were fed into 300 ml of acetone and filtered, and thereafter were dried at 70° C. in a normal atmosphere, thereby obtaining 50 g of a silver-palladium fine powder. This powder was composed of 70% of silver and 30% of palladium. It was observed from the results of X-ray diffraction that this powder was a mere mixture of silver and palladium as shown in FIG. 10, and did not display any change even after the heat-treatment at 200° C.

COMPARATIVE EXAMPLE 2

Figure 11:
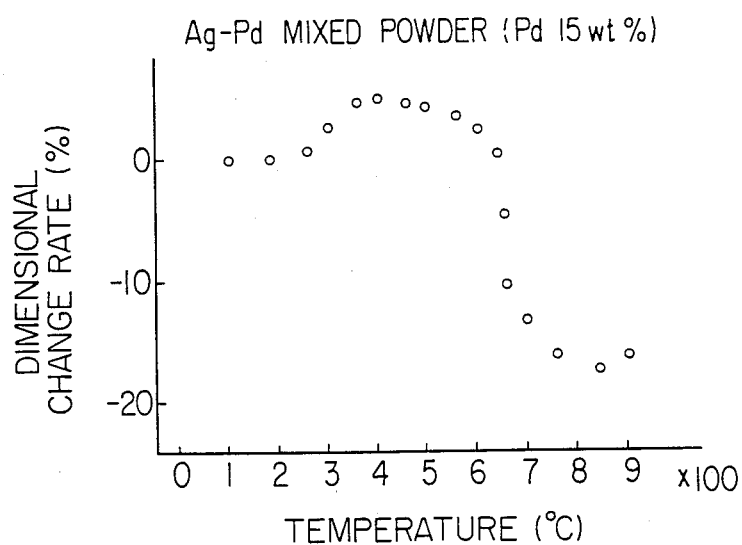
FIG. 11 is a view illustrating the relationship between the temperature and the dimensional change rate of the silver-palladium fine powder obtained by Comparative Example 2.
Figure 12:
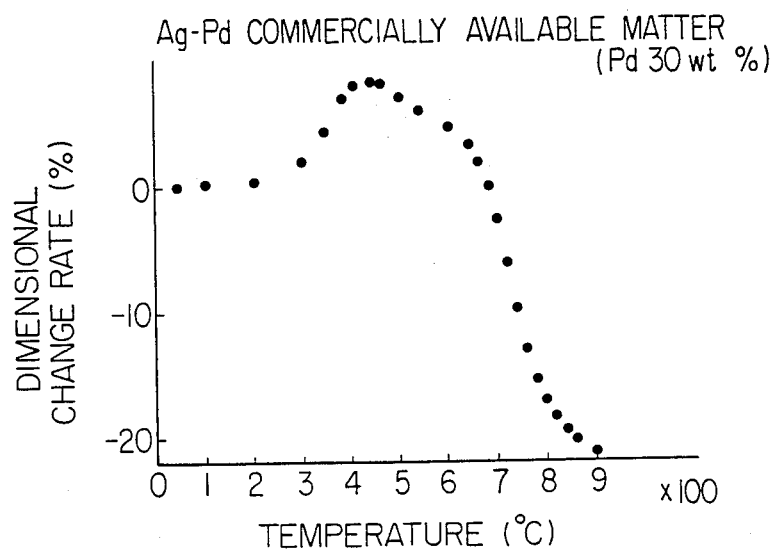
FIG. 12 is a view illustrating the relationship between the temperature and the dimensional change rate of the silver-palladium powder (Pd composition 30 wt.%) extracted from commercially available silver-palladium paste.

A silver-palladium mixed powder (palladium composition 15 wt.%) was obtained by mixing silver powder (0.5 micron meter) and palladium powder (0.1 micron meter) for a long period of time. This mixed powder was measured with respect to expansion and contraction in the same manner as employed in Example 1. The obtained results are shown in FIG. 11. It can be seen therefrom that the expansion and shrinkage at 350°-500° C. are very violent in comparison with the alloy powder obtained according to the present invention. The results obtained by measuring the expansion and contraction of a silver-palladium powder (Pd composition 30 wt.%) extracted from a commercially available silver-palladium paste are shown in FIG. 12.

It can be seen from the results that said expansion and contraction are still very violent in comparison with the alloy powder obtained according to the present invention.

What is claimed is:

1. A process for the production of silver-palladium alloy fine powders comprising the steps of:
   (1) forming an acidic solution containing silver and palladium as ions;
   (2) adding hydrazine or a hydrazine compound to said acidic solution;
   (3) forming reduction-separated silver-palladium alloy fine powders having an average particle diameter of 0.01–1.0 microns; and
   (4) heat-treating said reduction-separated silver-palladium alloy fine powders at a temperature of 100°–500° C. in an inert atmosphere or in a vacuum.

2. A process for the production of silver-palladium alloy fine powders comprising the steps of:
   (1) forming an acidic solution containing silver and palladium as ions;
   (2) adding hydrazine or a hydrazine compound as the sole reducing agent to said acidic solution; and
   (3) forming reduction-separated silver-palladium alloy fine powders having an average particle diameter of 0.01–10 microns.

3. A process for preparing a silver-palladium alloy fine powder, consisting essentially of the steps of adding hydrazine hydrate to an acidic aqueous reactant solution obtained by mixing aqueous silver nitrate solution and aqueous palladium nitrate solution with an aqueous nitric acid solution so that said reactant solution contains from 10 to 200 g/l of silver ions and from 10 to 200 g/l of palladium ions, the amount of hydrazine hydrate added to said reactant solution being from 2 to 10 times the stoichiometric amount needed to reduce said silver ions and said palladium ions to the corresponding metals, and mixing said hydrazine hydrate with said reactant solution to effect a reduction reaction, at a temperature of from 10° to 100° C., until said silver ions and said palladium ions are reduced to the corresponding metals and are precipitated as silver-palladium alloy fine powder having a particle size of from 0.01 to 10 μm and a specific area of from 5 to 30 m²/g; separating said silver-palladium alloy fine powder from said reactant solution; then washing said powder with water and then with an organic solvent which has a lower boiling point than water and is free of hydroxyl groups; then drying said powder; and then heating said powder at a temperature of from 100° to 500° C., in a vacuum or in contact with an inert atmosphere whereby to prevent oxidation of said silver-palladium alloy fine powder, said silver-palladium alloy fine powder, when tested by x-ray diffraction, exhibiting peaks characteristic of a silver-palladium alloy in the x-ray diffraction pattern.

4. The process according to claim 1 wherein the sum total of silver and palladium is 10–200 g per liter of said solution.

5. The process according to claim 2 wherein the sum total of silver and palladium is 10–200 g per liter of said solution.

6. The process according to claim 1 wherein said hydrazine or hydrazine compound is added 2–10 times the equivalent required for reducing silver ions and palladium ions in said solution into metals.

7. The process according to claim 2 wherein said hydrazine or hydrazine compound is added 2–10 times the equivalent required for reducing silver ions and palladium ions in said solution into metals.

8. The process according to claim 1 wherein said solution is maintained at 10°–100° C. on reduction separating.

9. The process according to claim 2 wherein said solution is maintained at 10°–100° C. on reduction separating.

10. The process according to claim 1 wherein as the materials for said silver and palladium there are used silver nitrate and palladium nitrate respectively, and as said acidic solution there is used an acidic nitric solution.

11. The process according to claim 2 wherein as the materials for said silver and palladium there are used silver nitrate and palladium nitrate respectively, and as said acidic solution there is used an acidic nitric solution.

* * * * *

UNITED STATES PATENT AND TRADEMARK OFFICE
CERTIFICATE OF CORRECTION

PATENT NO. : 4 776 883
DATED : October 11, 1988
INVENTOR(S) : Takao HAYASHI ET AL.

It is certified that error appears in the above-identified patent and that said Letters Patent is hereby corrected as shown below:

Column 8, line 63; after "specific" insert ---surface---.

Signed and Sealed this

Twenty-fifth Day of April, 1989

Attest:

DONALD J. QUIGG

*Attesting Officer*  *Commissioner of Patents and Trademarks*